(12) United States Patent
Latham et al.

(10) Patent No.: US 7,455,706 B2
(45) Date of Patent: Nov. 25, 2008

(54) FILTER SYSTEM FOR ELECTRONIC EQUIPMENT ENCLOSURE

(75) Inventors: Steven R. Latham, Aurora, IL (US); Marvin P. Garcia, Bloomington, IL (US); Michael R. Cosley, Crystal Lake, IL (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 0 days.

(21) Appl. No.: 11/821,953

(22) Filed: Jun. 26, 2007

(65) Prior Publication Data

US 2007/0251381 A1 Nov. 1, 2007

Related U.S. Application Data

(62) Division of application No. 10/722,810, filed on Nov. 26, 2003, now abandoned.

(51) Int. Cl.
*B01D 46/00* (2006.01)
*H02B 1/00* (2006.01)

(52) U.S. Cl. .................. 55/385.1; 55/486; 55/497; 55/500; 55/502; 55/522; 55/528; 95/900; 96/13; 96/14; 174/50; 174/37; 174/38

(58) Field of Classification Search .............. 55/385.1, 55/385.6, 481, 485, 486, 528, 497, 500, 502, 55/522; 96/424, 422, 397, 417, 13, 14; 454/184, 454/192; 174/50, 38, 37; 95/900
See application file for complete search history.

(56) References Cited

U.S. PATENT DOCUMENTS

| 5,014,908 A | 5/1991 | Cox |
| 5,346,518 A | 9/1994 | Baseman et al. |

(Continued)

FOREIGN PATENT DOCUMENTS

| EP | 0 904 826 A2 | 3/1999 |
| EP | 1 351 561 A2 | 10/2003 |

OTHER PUBLICATIONS

Robert E. Treybal, Mass Transfer Operations, McGraw-Hill, Inc. 1987 Reissue, Chapter 4, "Diffusion in Solids", pp. 88-101.

(Continued)

*Primary Examiner*—Jason M Greene
*Assistant Examiner*—Minh-Chau T Pham
(74) *Attorney, Agent, or Firm*—Harness, Dickey & Pierce, P.L.C.

(57) ABSTRACT

A filter system including a method for self cleaning the filter system of an electronic equipment enclosure where air flow is monitored either by monitoring fan performance of air flow velocity through the enclosure. The system includes two filters elements, an upstream ASHRAE or HEPA filter element to block particulate matter and a downstream PTFE filter element to block water vapor. The ASHRAE or HEPA filter element is relatively inexpensive and easy to clean. The PTFE filter element is more expensive and difficult to clean. Thus, the cheaper filter is used to protect the more expensive filter from contaminants and to increase its useful life. The method of self cleaning includes stopping the fan when a signal is received indicating a predetermined resistance to air flow which is a function of blockage of the filter elements, thereafter operating the fan at an increased rotational velocity to determine whether the fan itself is malfunctioning, thereafter slowing and stopping the fan to allow the fan to be reversed, rotating the fan in reverse for a predetermined period of time, such as five minutes, thereafter slowing and stopping the fan and returning the fan to its usual rotational velocity and direction. If the resistance to air flow is still above a predetermined level, the fan is again slowed, stopped and reversed and then returned to normal operation. The reversal operation can be conducted a multiple number of times, however, after a predetermined number, a signal is sent requesting maintenance.

17 Claims, 2 Drawing Sheets

U.S. PATENT DOCUMENTS

| | | | |
|---|---|---|---|
| 5,378,254 | A | 1/1995 | Maly et al. |
| 5,429,649 | A | 7/1995 | Robin |
| 5,461,368 | A | 10/1995 | Comer |
| 5,507,847 | A | 4/1996 | George et al. |
| 5,668,535 | A | 9/1997 | Hendrix et al. |
| 5,711,785 | A | 1/1998 | Maxwell |
| 5,730,770 | A | 3/1998 | Greisz |
| 5,886,296 | A | 3/1999 | Ghorbani et al. |
| 5,914,453 | A | 6/1999 | James et al. |
| 5,942,017 | A | 8/1999 | Van Winkle, Sr. |
| 5,997,614 | A | 12/1999 | Tuma et al. |
| 5,997,618 | A | 12/1999 | Schneider et al. |
| 6,063,152 | A | 5/2000 | Teter |
| 6,128,159 | A | 10/2000 | Ino |
| 6,146,446 | A | 11/2000 | Tuma et al. |
| 6,168,651 | B1 | 1/2001 | Tuma et al. |
| 6,214,070 | B1 | 4/2001 | Crowder et al. |
| 6,214,095 | B1 | 4/2001 | Logan et al. |
| 6,238,467 | B1 | 5/2001 | Azarian et al. |
| 6,296,691 | B1 | 10/2001 | Gidumai |
| 6,319,114 | B1 | 11/2001 | Nair et al. |
| 6,395,073 | B1 | 5/2002 | Dauber |
| 6,423,118 | B1 | 7/2002 | Becerra et al. |
| 6,507,282 | B1 | 1/2003 | Sherwood |
| 6,532,151 | B2 | 3/2003 | Osecky et al. |
| 6,582,113 | B2 | 6/2003 | Rogers |
| 6,660,070 | B2 * | 12/2003 | Chung et al. .................. 96/424 |
| 6,758,876 | B2 | 7/2004 | Suzuki et al. |
| 6,770,109 | B2 | 8/2004 | Tanaka et al. |
| 6,913,637 | B2 | 7/2005 | Kim |
| 2003/0010490 | A1 | 1/2003 | Reeck |
| 2004/0168417 | A1 * | 9/2004 | Tanaka et al. .................. 55/486 |
| 2004/0187451 | A1 * | 9/2004 | Suzuki et al. .............. 55/385.1 |
| 2005/0132681 | A1 | 6/2005 | Chu |

OTHER PUBLICATIONS

R. Byron Bird, Warren E. Stewart and Edwin N. Lightfoot, "Transport Phenomena", Wiley & Sons, 1960, pp. 502-513.

Charles J. Weschler, Stephen P. Kelty and Joyce E. Lingousky, "The Effect of Building Fan Operation on Indoor-Outdoor Dust Relationships", Control Technology News, Journal of Air Pollution Control Association, vol. 33, No. 6, Jun. 1983, pp. 624-629.

William W. Nazaroff and Glen R. Cass, "Mathematical Modeling of Chemical Reactive Pollutants in Indoor Air", Environ. Sci. Technol. vol. 20, No. 9, 1986, pp. 924-934.

J.D. Sinclair, "Corrosion of Electronics", Journal of the Electrochemical Society, Mar. 1988, pp. 89C-95C.

Charles J. Weschler and Helen C. Shields, "The Impact of Ventilation and Indoor Air Quality on Electronic Equipment", ASHRAE Transactions, Part I: Symposia, pp. 455-463, 1988.

Kvestoslav R. Spurny, "Single Fiber Collection Efficiency", Advances in Aerosol Filtration, Lewis Publishers, 1998, pp. 32-49.

Kvestoslav R. Spurny, "Performances of an Air Filter at Dust-Loaded Condition", Advances in Aerosol Filtration, Lewis Publishers, 1998, Chapter 16, pp. 323-335.

* cited by examiner

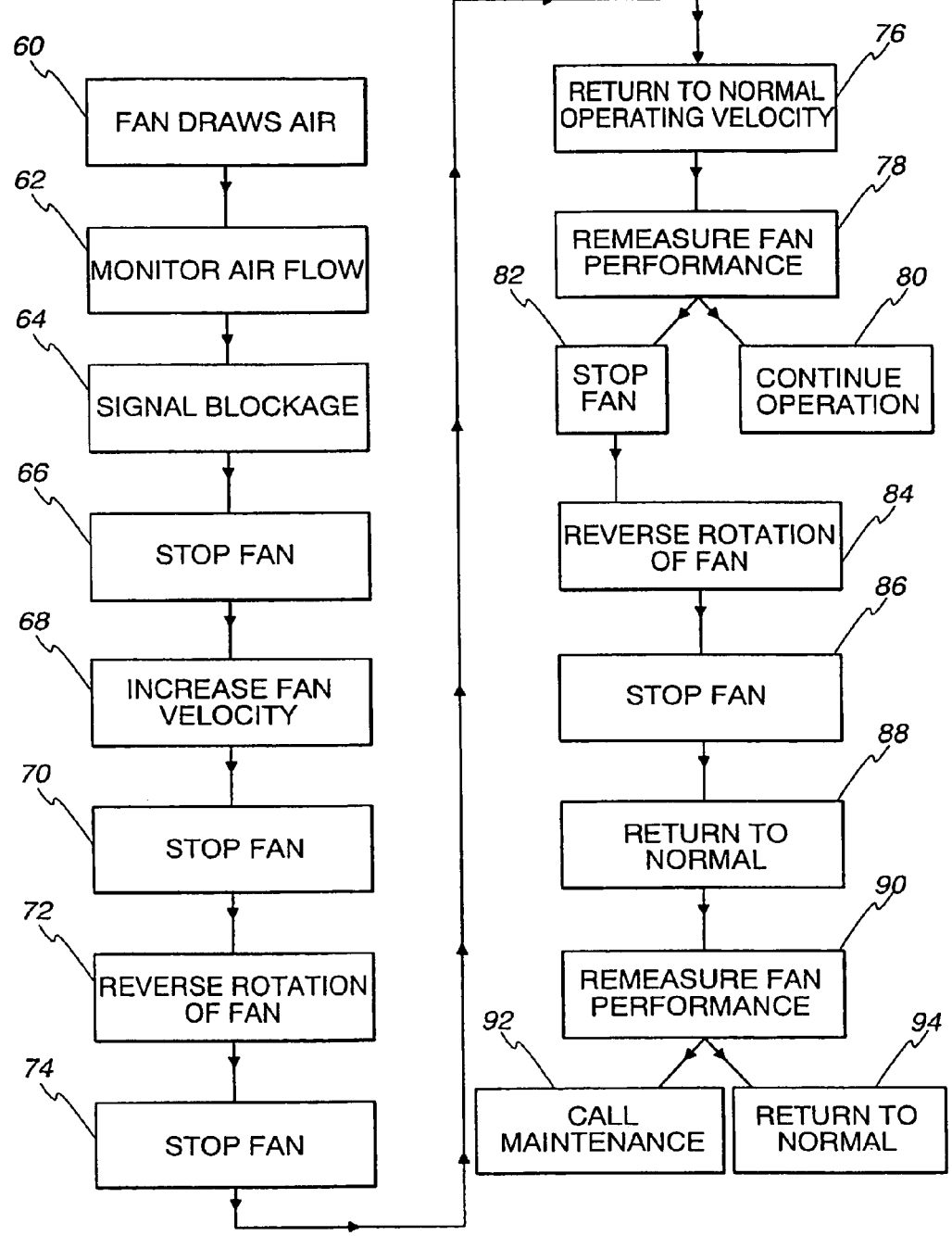

FILTER SYSTEM FOR ELECTRONIC EQUIPMENT ENCLOSURE

CROSS-REFERENCE TO RELATED APPLICATIONS

This is a divisional of U.S. application Ser. No. 10/722,810 filed Nov. 26, 2003 now abandoned, the entire disclosure of which is incorporated herein by reference.

FIELD OF THE INVENTION

The present invention relates to a filter system, and more particularly to a two filter element system for filtering particulate matter from an air flow path at an upstream location and water vapor at a downstream location.

DESCRIPTION OF THE RELATED ART

Electronic equipment enclosures are often located out-of-doors. Examples of such electronic hardware are telecommunication equipment, cable television equipment and data transmission equipment. Often this class of equipment is referred to as "outside plant equipment" and/or "remote terminals." Also, it is well known that this equipment generates heat and undesirable gas so that some sort of cooling and/or ventilation is required. Further, this outside plant equipment may be located just about any place on earth, where it may be exposed to inhospitable climates, such as very warm, cold, wet, dry and/or windy conditions.

Equipment enclosures containing sensitive but heat generating electronic equipment are sensitive to the environment in which the equipment enclosure is located. For example, humidity, salt, fog, oil, dust, rain and the like tend to degrade the performance of and potentially destroy electronic equipment that has not been properly "hardened" to allow deployment in harsh environments. Even some indoor environments are considered harsh. Thus, electronic equipment operating in certain types of chemical plants must also be hardened.

Relative humidity governs the amount of moisture contained in materials at equilibrium. The amount of moisture is almost independent of temperature. Most air normally contains a certain amount of water vapor. Oxygen in the air reacts with metal where the reaction is facilitated by the presence of water on the surface of the metal. Very thin aqueous films can form on metal even at less than 100 percent relative humidity. Corrosion ensues and may be increased when contaminated with industrial pollutants, such as chlorides and sulfides. Further, chemical reaction rates increase with increasing temperatures, increasing concentrations of reactants and under increased pressures.

Reliability of electronic equipment is typically linked to relative humidity, whereas the process of moisture diffusion through materials is linked to absolute humidity. It has been demonstrated that there is a critical relative humidity above which corrosion is rapid but below which corrosion is low. For most metals the critical relative humidity is between 70 and 80 percent.

To minimize cost, it would be desirable to use electronic equipment which has not been hardened. In other words, it would be desirable to use indoor rated electronic equipment in an outdoor environment or an indoor corrosive environment thereby saving the expense of hardening the equipment.

The problem associated with electronic equipment being exposed to harsh environments has been addressed in such books as *Advances In Aerosol Filtration*, Kvestoslav Spurney Editor, Lewis Publishing, 1998; *Mass Transfer Operations*, Treybal, McGraw Hill, 1987 and *Transport Phenomenon*, Bird, Stewart and Lightfoot, Wiley 1960. Articles have also appeared, such as, "The Impact Of Ventilation And Indoor Air Quality On Electronic Equipment" by C. J. Weschler and H. C. Shield, ASHRAE Transactions, Part I: Symposia, pp. 455-463 (1991); "Mathematical Modeling Of Chemical Reactive Pollutants In Indoor Air", Environmental Science Technology, Vol. 20, No. 9, pp. 924-934 (1986); "Corrosion Of Electronics", by J. D. Sinclair in Journal of the Electrochemical Society, pp. 89C-95C, March 1988 and "The Effect of Building Fan Operation on Indoor-Out-Door Dust Relationships by C. J. Weschler, S. P. Kelty and J. E. Lingovsky in the Journal of Air Pollution Control Association, Vol. 33, pp. 624-629, (1983).

Several patents have attempted to address corrosion problems, including U.S. Pat. No. 5,886,296; U.S. Pat. No. 6,063,152 and U.S. Pat. No. 6,395,073. There have also been patents dealing with filtering, monitoring and obstructions clearing including U.S. Pat. No. 5,014,908; U.S. Pat. No. 5,378,254; U.S. Pat. No. 5,429,649; U.S. Pat. No. 5,461,368; U.S. Pat. No. 5,668,535; U.S. Pat. No. 5,711,785; U.S. Pat. No. 5,914,453; U.S. Pat. No. 6,507,282 and U.S. Pat. No. 6,532,151.

SUMMARY

The difficulties encountered with previous devices have been overcome by the present invention. The present invention relates to a filter system having at least two filter elements in an air flow path formed in an electronic equipment enclosure where an upstream filter element is structured to filter particulate matter and a downstream filter element is structured to a filter water vapor.

There are a number of advantages, features, and objects achieved with the present invention which are believed not to be available in earlier related devices. One such advantage is that using a two filter system with a particulate filter element upstream and a water vapor filter element downstream blocks undesirable contaminants from entering the electronic enclosure and degrading the equipment inside. The two filter system also protects the water vapor filter element which is more expensive and harder to clean with the upstream particulate filter element which is less expensive and easier to clean. The invention also allows the use of commercial grade components in an outdoor electronic equipment enclosure without requiring the added cost inherent in hardening those components for a harsh climatic deployment.

A more complete understanding of the present invention and other objects, advantages and features thereof, will be gained from a consideration of the following description of a preferred embodiment read in conjunction with the accompanying drawing provided herein. The embodiment represents an example of the invention which is described here in compliance with Title 35 U.S.C. section 112 (first paragraph), but the invention itself is defined by the attached claims.

BRIEF DESCRIPTION OF THE DRAWINGS

FIG. 4 is a flow diagram illustrating a method of testing and cleaning a filter in an outdoor electronic equipment enclosure.

DETAILED DESCRIPTION

Figure 1:
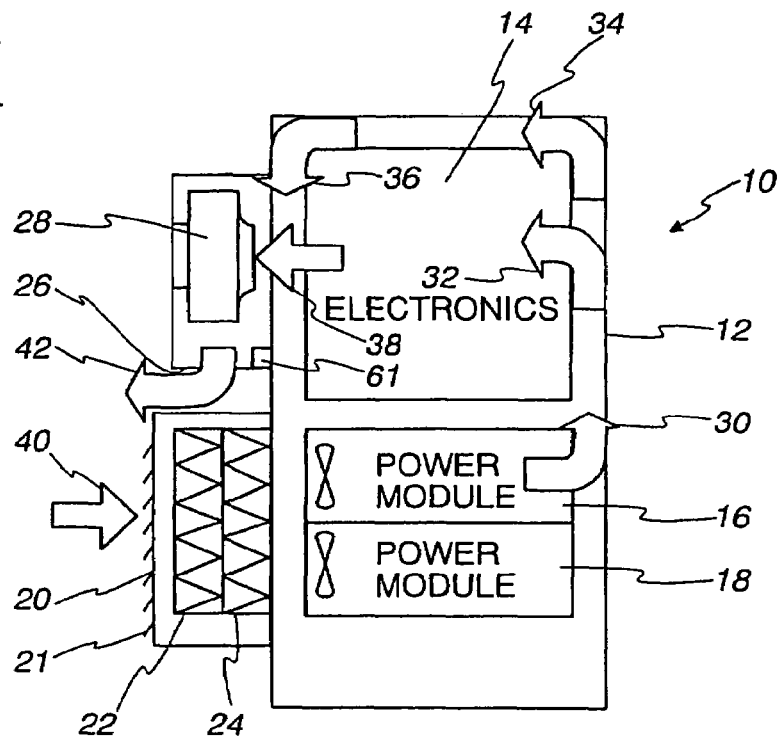
FIG. 1 is a diagrammatic view of an outdoor electronic equipment enclosure illustrating the two filter arrangement.

While the present invention is open to various modifications and alternative constructions, the preferred embodiment shown in the various figures of the drawing will be described herein in detail. It is understood, however, that there is no intention to limit the invention to the particular embodiment, form or example disclosed. On the contrary, the intention is to cover all modifications, equivalent structures and methods, and alternative constructions falling within the spirit and scope of the invention as expressed in the appended claims, pursuant to Title 35 U.S.C. section 112 (second paragraph).

Referring now to FIG. 1, there is shown a diagrammatical outdoor enclosure 10 having a main housing 12 which has in its upper portion sensitive electronic equipment 14 and in its lower portion two power modules 16, 18. In keeping with the present invention, an inlet housing 20 is provided to allow ingress of ambient air through a louver 21 and two filter elements, an ASHRAE 52 95% or HEPA filter element 22 ("ASHRAE") and a PTFE filter element 24 ("PTFE"). The outdoor enclosure also includes an outlet housing 26 and an exhaust fan 28. It can be appreciated that the exhaust fan creates an air flow path for air through the interior of the housing which are diagrammatically depicted by several arrows, 30, 32, 34, 36, 38. The incoming air is depicted by an arrow 40 and the exhaust air is depicted by an arrow 42. Thus, the filter element 22 is upstream in terms of air flow compared to the filter element 24 which is downstream. The air flow path starts outside the inlet housing 20, continues through the filter elements and around the power modules, through the electronics chamber housing the electronics 14, through the fan 28 and out of the outlet housing 26.

The ASHRAE filter element 22 blocks particulate matter and the PTFE filter element 24 filters water vapor. The ASHRAE filter element lets water vapor through but is relatively inexpensive. If the filter element becomes clogged, it is relatively easy to clean. The PTFE filter element blocks water vapor as mentioned but it clogs easily and is difficult to clean. An important feature of the present invention is that the use of both filter elements in the specific positions shown achieves a very desirable result.

The PTFE element filters water vapor. Allowing water vapor into the enclosure will accelerate the deterioration of the electronic equipment in a typical outdoor enclosure. However, such a filter element is expensive to clean and to replace. However, by placing the ASHRAE element upstream of the PTFE element, particulate matter is filtered and thus mostly never reach the PTFE element. As mentioned, the ASHRAE is relative inexpensive and is easy to clean. Thus, the ASHRAE filter as the dual functions of preventing most particulate matter from reaching the enclosure and also of protecting the PTFE filter so that the life and usefulness of the PTFE filter is enhanced.

The ASHRAE filter element costs about $0.08 per square inch and may be cleaned with mild soap and water. The PTFE filter element costs about $0.55 per square inch, some seven times the cost of the ASHRAE filter element and must be cleaned with a solvent. Moreover, any mechanical action on the filter element, such as wiping or brushing may damage the filter element of alter pore size, resulting in a very different performance level than would be expected. With an ASHRAE filter element upstream, a PTFE filter element may last between two and four times longer than would be the situation with no ASHRAE filter element. The filter elements identified are well known to those skilled in the art and are readily available commercially.

The exhaust fan 28 may have a 225 millimeter diameter impeller to cause an air flow through the enclosure of between 225 and 275 cubic feet per minute.

It is noted that the modified outdoor enclosure 10 includes the advantages of filtering both particulate and liquid vapor in a single aerosol filtration design. All types of vapor, such as, oil and salt, for example, are included in an effort to encompass all typical outdoor vapors and various indoor industrial environments. This filtering arrangement eliminates or greatly reduces the ingress of detrimental aerosols that promote corrosion, fungus growth and the like which are well known to degrade performance of or destroy the electronic components in the outdoor enclosure. The result is that the modified enclosure allows for the deployment of commercial indoor grade electronic components in outdoors or harsh indoor environments, and there is no need to incur additional costs to upgrade the components. This more than offsets the added cost of a dual filter arrangement.

Figure 2:
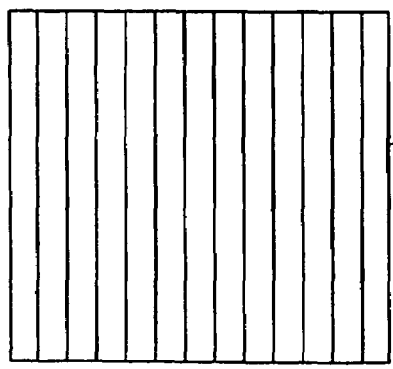
FIG. 2 is a diagrammatic elevation view of a "V" folded filter.
Figure 3:
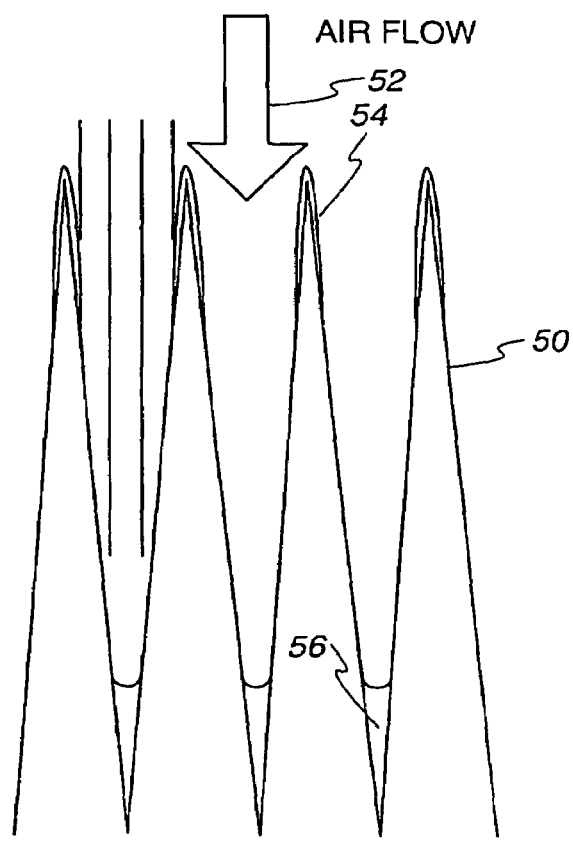
FIG. 3 is a top plan view of the filter shown in FIG. 2.

Referring now to FIGS. 2 and 3, there is illustrated a V-folded particulate filter element 50 where an arrow 52 represents air flow direction. Large particles will accumulate at the leading edge 54 of each fold whereas finer particles 56 form a meniscus at the trailing edge of each fold.

Particles less than 2.5 microns in diameter are referred to as "fine" particles. Sources of such fine particles include all types of combustion from such sources as motor vehicles, power plants, wood burning and the like as well as some industrial processes. Particles with diameters between 2.5 and 10 microns are referred to as "coarse". Sources of coarse particles include crushing or grinding operations and dust from paved or unpaved roads. Fine and coarse particles typically exhibit different behaviors in the atmosphere. Coarse particles tend to settle from the atmosphere within hours and their spatial impact is typically limited because they fall out of the air in a downwind area near their source. Fine particles, however, remain suspended for longer periods, on the order of days or weeks, and travel much further away from their source.

The upstream filter element 22 is for the removal of particulate matter with a pressure drop of approximately 0.1 to 0.25 in water. These filter elements are designated as ASHRAE 52 95% or HEPA. The downstream filter element 24 is hydrophobic, picking up particles 10 microns in size for moisture control with a pressure drop of approximately 0.4 to 0.6 in water. Access to the upstream filter is facilitated because of its location. Thus, it may be easily removed for manual cleaning or it maybe replaced just as easily. The downstream filter element 24 may be somewhat less accessible although it need not be so.

Air is directed through the enclosure to cool and/or vent the enclosure interior. The air is first drawn through the two filters 60, FIG. 4. This air is used to cool the power modules 16, 18, FIG. 1 as well as the electronics 14. The exhaust fan can be operated through a controller to be either always on, or alternately off and on as a function of temperature and/or humidity. Rotational velocity of the fan may also be controlled by temperature and/or humidity measurements. Sensors and controls are depicted by the box 61, FIG. 1, attached to the outdoor enclosure 10.

A screen, not shown, may be placed around the exhaust fan or outlet 26 to minimize insect intrusion. An air flow damper, not shown, may also be installed where the exhaust air forces the damper open but gravity closes the damper when the fan is off to minimize any ambient air intake through the outlet 26.

The enclosure filter system includes a self cleaning feature for more efficient operation. As mentioned, the fan 28 draws outside air through the filter elements 22, 24 and into the interior of the housing 12 to cool and ventilate the electronics located within the housing. As the air flows through the filter elements more and more particles are deposited on the outer or upstream filter element 22 as exemplified in FIGS. 2 and 3 and the flow becomes more difficult. This is often described in terms of a pressure drop across the filter element. Thus, the air flow must be monitored 62 to determine this flow resistance. The cleaner the filter element, the lower the pressure drop because the air flow is impeded to a lesser degree. As the filter element traps or filters more and more particles, the air flow becomes more and more impeded and the pressure drop across the filter element increases. An increasing pressure drop causes the fan to work harder and results in a decrease in the fan's rotational velocity and/or an increase in electric current draw required to operate the fan. Increasing current draw increases cost and a slower fan may not draw in sufficient air to provide proper cooling and/or ventilation. Furthermore, making the fan work harder may shorten the life of the fan motor, creating another economic concern.

Sensors for measuring current flow and/or rotational velocity of an exhaust fan is well known to those skilled in the art so these characteristics of the fan are often used to estimate filter performance. The sensors may be used to alert the need for manual cleaning or replacement or they may be used through the controls to initiate an automatic cleaning procedure as will be explained. Controls are also well known to those skilled in the art.

An important feature of the present invention is that the enclosure system has filter self cleaning capabilities which increases the overall efficiency of the enclosure by delaying the need for replacement of the filters. For example, if a blockage can be alleviated, the filters may function at a satisfactory level for an additional time and thereby delay the need for a visit by maintenance personnel.

The enclosure system monitors the filter as a function of fan performance (although other techniques may be used as an alternative). When a predetermined set point is reached, i.e., resistance to air flow reaches a predetermined quantity, indicating the degree of blockage, the fan is signaled 64 to slow and stop 66. The fan is also signaled to increase or ramp up its rotational velocity 68, usually to a maximum, to verify that the fan itself is functioning properly. After ramping the fan to a high rotational velocity, the fan is then stopped 70 and its direction of rotation is reversed 72. This step is done with the hope that the blocking contaminants will be blown away from the filter. The reverse rotation continues for a predetermined period of time, such as five minutes and then the fan is again slowed and stopped 74 and thereafter returned to normal operating velocity 76, perhaps seventy percent of maximum and remeasured 78 to determine fan performance. If the blockage is removed or reduced to an acceptable level, normal operation continues 80 because the fan performance is below the predetermined set point. If, however, the blockage remains, the steps of stopping 82 and reversing 84 the rotation of the fan is again performed. The fan is then stopped 86, returned to normal velocity 88 and airflow is remeasured 90. The reversing operating may be tried several more times if desired. If after a predetermined number of reversals of the fan are completed and the unacceptable blockage remains, then a signal is sent indicating the need for maintenance personnel 92 who will either replace or clean the blocked filters. If the blockage is removed or reduced to an acceptable level 94, then the system has efficiently extended the useful life of the filters without need for human intervention. This, of course, saves money by reducing maintenance cost.

The above specification describes in detail a preferred embodiment of the present invention. Other examples, embodiments, modifications, and variations will, under both the literal claim language and the doctrine of equivalents, come within the scope of the invention defined by the appended claims. For example, whether fan performance, air flow rate measurement or some other measurement is used to trigger the self cleaning feature of the fan is immaterial to the system and all will come within the literal language of the claims. Furthermore, whether the fan is reversed one time or several times, the system is still within the appended claims. Also, the exact nature of the filter elements may be changed. Indeed, the number of filter elements may be increased depending upon the environment in which the enclosure is to be laced. Still other alternatives will also be equivalent as well many new technologies. There is no desire or intention here to limit in any way the application of the doctrine of equivalents nor to limit or restrict the scope of the invention.

What is claimed is:

1. A method of using an electronic equipment enclosure having indoor grade electronics in an outdoor environment, the electronic equipment enclosure including an inlet, an outlet, an air flow path extending through the electronic equipment enclosure from the inlet to the outlet, a vapor filter positioned in the air flow path, and a separate, removable particle filter positioned in the air flow path upstream of the vapor filter, the method comprising:
installing the electronic equipment enclosure in an outdoor environment;
intaking ambient air from the outdoor environment into the air flow path via the inlet; and
exhausting the ambient air from the air flow path via the outlet, the ambient air passing through the particle filter before passing through the vapor filter to remove particles from the ambient air before the ambient air reaches the vapor filter, the particle filter thereby protecting and extending the useful life of the vapor filter.

2. The method of claim 1 wherein the particle filter is one of an ASHRAE filter and a HEPA filter, and the vapor filter is a PTFE filter.

3. The method of claim 1 wherein the electronic equipment enclosure includes a fan.

4. The method of claim 3 wherein the electronic equipment enclosure includes a controller for controlling the fan.

5. The method of claim 4 wherein the controller is configured to change the fan's direction of rotation.

6. The method of claim 5 wherein the controller is configured to change the fan's velocity.

7. The method of claim 5 wherein the electronic equipment enclosure includes a sensor for monitoring air flow resistance, and wherein the controller is responsive to the sensor.

8. The method of claim 7 wherein the electronic equipment enclosure is configured to change the direction and/or velocity of the fan based on the sensed air flow resistance.

9. The method of claim 1 wherein the particle filter is positioned for easier access than the vapor filter.

10. The method of claim 1 further comprising removing the particle filter for cleaning or replacing the particle filter.

11. The method of claim 1 further comprising replacing the particle filter and the vapor filter.

12. A method of intaking air into an electronic equipment enclosure, the electronic equipment enclosure including an inlet housing, the inlet housing including a vapor filter and a separate, removable HEPA filter and a vapor filter, the HEPA filter being upstream from the vapor filter, the method comprising positioning the electronic equipment enclosure in an outdoor environment such that air flows from the outdoor environment through the HEPA filter before the vapor filter.

13. The method of claim 12 wherein the electronic equipment enclosure includes indoor grade electronic components.

14. The method of claim 12 wherein the electronic equipment enclosure includes an exhaust fan for facilitating air flow through the HEPA filter and the vapor filter.

15. The method of claim 13 wherein the exhaust fan is configured to change direction and/or velocity.

16. The method of claim 15 wherein the exhaust fan is responsive to a sensor monitoring resistance to air flow.

17. A method of intaking outdoor air into an electronic equipment enclosure, the electronic equipment enclosure including indoor grade electronics, at least one power module, an inlet housing and a outlet housing, the inlet housing including a removable particle filter, a vapor filter and louvers, the vapor filter positioned downstream of the particle filter and the louvers, the outlet housing including an exhaust fan, the method comprising installing the electronic equipment enclosure in an outdoor environment such that the exhaust fan facilitates air flow from the outdoor environment through the louvers, the particle filter and the vapor filter into an interior of the electronic equipment enclosure.

* * * * *